(12) United States Patent
Gotoh et al.

(10) Patent No.: US 6,931,344 B2
(45) Date of Patent: Aug. 16, 2005

(54) TEST CIRCUIT AND SEMICONDUCTOR INTEGRATED CIRCUIT EFFECTIVELY CARRYING OUT VERIFICATION OF CONNECTION OF NODES

(75) Inventors: Kohtaroh Gotoh, Kawasaki (JP); Koji Aoyagi, Kawasaki (JP); Kazuhiro Terashima, Kawasaki (JP); Shigeru Nishio, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 295 days.

(21) Appl. No.: 10/082,055

(22) Filed: Feb. 26, 2002

(65) Prior Publication Data

US 2003/0046015 A1 Mar. 6, 2003

(30) Foreign Application Priority Data

Sep. 5, 2001 (JP) ...................................... 2001-269216

(51) Int. Cl.[7] .............................................. G01F 19/00
(52) U.S. Cl. ........................................ 702/117; 714/47
(58) Field of Search ............................... 702/117, 118, 702/59, 65, 182–185, 188; 375/133, 213, 224, 25, 47; 324/500; 714/25, 47

(56) References Cited

U.S. PATENT DOCUMENTS

| | | | |
|---|---|---|---|
| 4,698,830 A | | 10/1987 | Barzilai et al. ............... 377/19 |
| 4,855,669 A | * | 8/1989 | Mahoney ................... 324/73.1 |
| 5,287,386 A | | 2/1994 | Wade et al. .................. 375/36 |
| 5,299,136 A | | 3/1994 | Babakanian et al. ........ 364/488 |
| 5,598,541 A | * | 1/1997 | Malladi ...................... 710/106 |
| 5,706,297 A | * | 1/1998 | Jeppesen et al. ............. 714/30 |
| 6,304,987 B1 | * | 10/2001 | Whetsel, Jr. ................ 714/724 |
| 6,349,398 B1 | * | 2/2002 | Resnick ...................... 714/733 |
| 6,578,180 B2 | * | 6/2003 | Tanner .......................... 716/4 |
| 6,629,297 B2 | * | 9/2003 | Ganesan et al. ............... 716/5 |

OTHER PUBLICATIONS

"Integration of IEEE 1149.1 with Mixed ECL, TTL, and Differential Logic Signals", John Andrews, 1993 IEEE, pp. 355–360.
"Built–In Parametric Test For Controlled Impedance I/Os", Tord Haulin, 1997 IEEE, pp. 123–128.

* cited by examiner

Primary Examiner—Marc S. Hoff
Assistant Examiner—Edward Raymond
(74) Attorney, Agent, or Firm—Arent Fox PLLC

(57) ABSTRACT

A test circuit is incorporated in a device having an output circuit for outputting a signal, and the test circuit carries out a verification of a connection of nodes of the device. The test circuit has a test data generating circuit and a test output buffer connected in parallel with output nodes of the output circuit. The test data generating circuit generates test data for carrying out a verification of a connection of the output nodes, and the test output buffer receives test data from the test data generating circuit and outputs the test data to the output nodes. Similarly, a test circuit is incorporated in a device having an input circuit for inputting a signal, and the test circuit carries out a verification of a connection of nodes of the device. The test circuit has a test data generating circuit and a test input buffer connected in parallel with input nodes of the input circuit. The test data generating circuit generates test data for carrying out a verification of a connection of the input nodes, and the test input buffer receives test data from the test data generating circuit and inputs the test data to the input nodes.

27 Claims, 14 Drawing Sheets

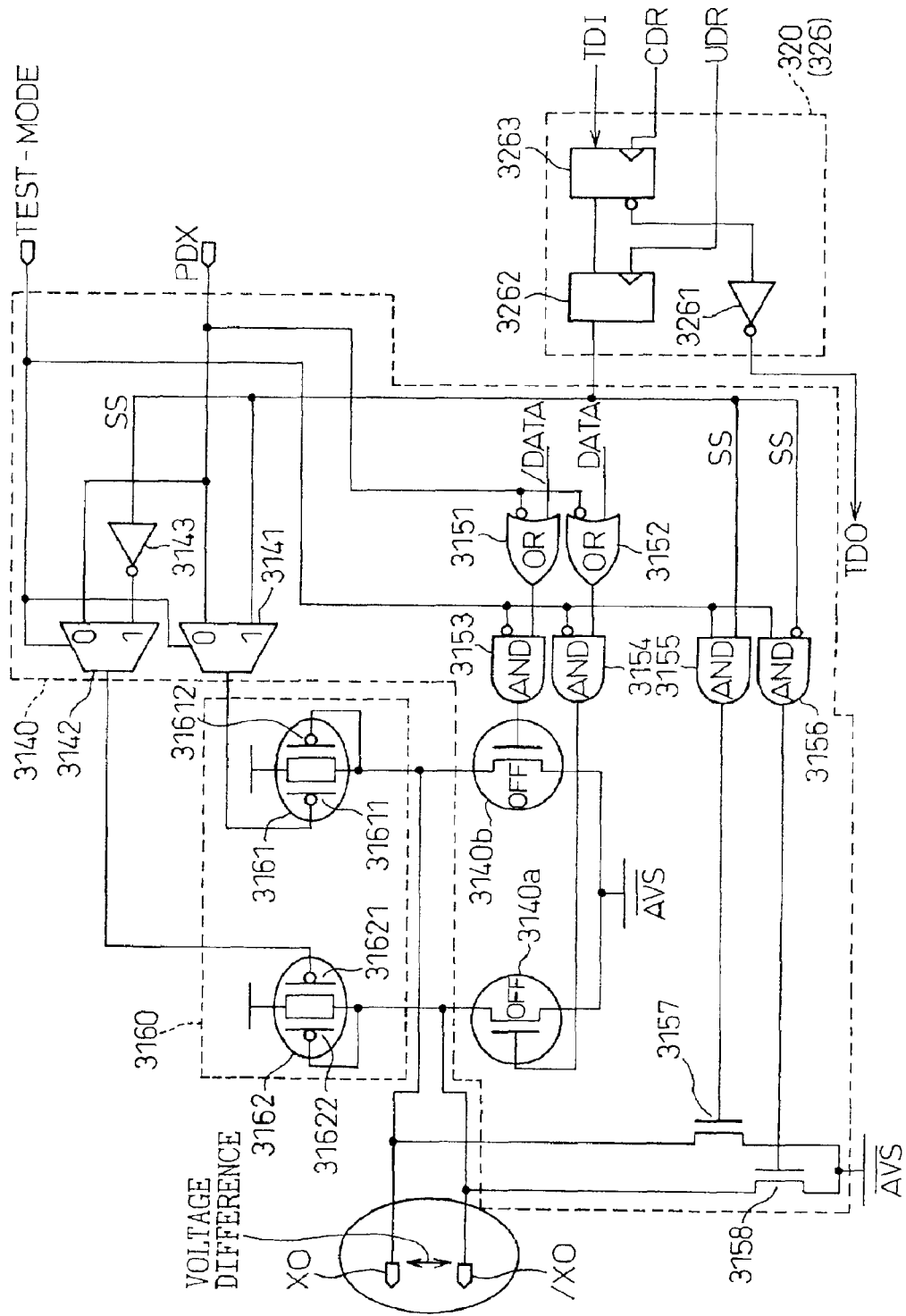

TEST CIRCUIT AND SEMICONDUCTOR INTEGRATED CIRCUIT EFFECTIVELY CARRYING OUT VERIFICATION OF CONNECTION OF NODES

BACKGROUND OF THE INVENTION

1. Field of the Invention

The present invention relates to a testing technique for testing a signal transmission system that carries out transmission and reception of signals at high speed between LSI circuits (large-scale integrated circuits) or between devices. More particularly, the present invention relates to a test circuit that carries out a verification of a connection of nodes, and a semiconductor integrated circuit device to which the test circuit is applied.

2. Description of the Related Art

In recent years, there has been a remarkable improvement in the performance of parts that constitute computers and other information processing units. Along with this improvement, it has become necessary to carry out transmission and reception of signals at high speed between LSIs (LSI chips) and between devices consisting of a plurality of LSIs. In other words, it has become necessary to carry out a high-speed transmission of large-capacity signals between LSIs and between devices consisting of a plurality of LSIs. For example, in the solution service for network infrastructures, a high-speed transmission in the order of giga bits has become necessary, and a device called a "giga bit SERDES (Serializer and Deserializer)" has come to attract attention.

For a relatively low-speed data transmission in the order of dozens of MHz, a single end transmission system (a system for transmitting data using one signal line) like a TTL system has conventionally been used. However, the single end transmission system has drawbacks in that the system easily receives external noise, and that the transmission distance is short. Further, EMI (electromagnetic interface: electromagnetic radiation noise) occurs easily.

As the single end transmission system has the above problems, systems like the PCML (pseudo-current mode logic) system and the LVDS (low-voltage differential signaling) system that use differential signals (complementary signals) have come to be used for transmission/reception terminals for high-speed data transmission. These systems use two signal lines to transmit data using differential signals of small amplitudes. It is possible to reduce EMI to about one fifth of that of the single end transmission system, and it is also possible to cancel noise between the two differential signal lines. Therefore, it is possible to transmit data over a distance of dozens of meters. Further, as the differential signals have small amplitudes, it is possible to restrict crosstalk.

When a system including a transmitting/receiving circuit (an output circuit and an input circuit) for realizing a high-speed transmission is considered, it is also necessary to pay attention to a method of testing this system. In general, in order to confirm a connection status of signals within a printed substrate, a JTAG (joint-test action group) test (a boundary scan test) is carried out. In other words, in line with reduction in weight and sizes of electronic parts and progress of package techniques, an in-circuit test based on the JTAG has been established as a standard technique.

The boundary scan is architecture for exchanging data with a target semiconductor integrated circuit device (LSI). A mechanism for boundary scanning is built into the LSI. In other words, boundary scan cells that perform operations equivalent to that of a test robe are provided between the core and pins inside the LSI. These boundary scan cells are connected to structure a shift register. A test (a keyboard test or the like) is carried out based on the control of this shift register.

However, at present, there is no example of a JTAG test that takes into account the differential terminals of the PCML system or the LVDS system, in the system built in with the transmitting/receiving circuit. There has not yet been an established technique for inserting a BSR (boundary scan register) and a testing method. A test circuit like a BSR at a transmitter side is connected to an input stage of a transmitting circuit (output circuit), and test data is transmitted from the test circuit through the output circuit. In the mean time, a test circuit at a receiver side is connected to an output stage of a receiving circuit (input circuit), and the test data is received through the input circuit.

As explained above, in order to carry out an operation test of an LSI chip or a test of connection between a package and a board on which the package is mounted (board test), it is necessary to carry out a test based on a boundary scan. For confirming a connection between a system including a transmitting/receiving circuit and an external circuit, it is inefficient to test a single end terminal and differential terminals separately.

When it is possible to carry out a JTAG test for differential terminals in a similar manner to that for a single end terminal, it becomes possible to perform the test in one pass. This can reduce test time and improve the test efficiency. In this case, it is necessary that test data is output from the output circuit to the transmitter terminal. On the other hand, it is necessary that the input circuit receives the test data that is input from the receiving terminal.

However, when a signal processing circuit for carrying out a high-speed serial-to-parallel conversion, a transmitting circuit (output circuit) and a receiving circuit (input circuit) are connected together, the insertion of a test circuit like a BSR (boundary scan register) into between the transmitting circuit or the input circuit (receiving circuit) and the signal processing circuit lowers the transmission performance. Further, in the case of a differential output and a differential input, it is not possible to install a conventional BSR on the terminal.

SUMMARY OF THE INVENTION

An object of the present invention is to provide a test circuit that effectively carries out a verification of a connection of nodes, and a semiconductor integrated circuit device to which this test circuit is applied.

According to the present invention, there is provided a test circuit that is incorporated in a device having an output circuit for outputting a signal, and that carries out a verification of a connection of nodes of the device, the test circuit comprising a test data generating circuit generating test data for carrying out a verification of a connection of output nodes of the output circuit; and a test output buffer, connected in parallel with the output nodes, receiving test data from the test data generating circuit and outputting the test data to the output nodes.

Further, according to the present invention, there is also provided a semiconductor integrated circuit device having an output circuit transmitting a signal, and a test circuit carrying out a verification of a connection of nodes, the test circuit comprising a test data generating circuit generating test data for carrying out a verification of a connection of output nodes of the output circuit; and a test output buffer, connected in parallel with the output nodes, receiving test data from the test data generating circuit and outputting the test data to the output nodes.

The output circuit may output a differential signal, and the test output buffer may output the test data to the differential output nodes. The test circuit may carry out the verification of the connection of the output nodes in a differential signal status.

The test circuit may further comprise ESD protectors connected between the output nodes and the test output buffers. When the output circuit has a function of converting parallel data into serial data, the test data generating circuit may also have a function of converting parallel data into serial data. The test data generating circuit may be constructed of a circuit that has a register function capable of performing scanning. A test clock, which is different from an operation clock of the output circuit, may be supplied to the test data generating circuit. The test data generating circuit may output test data which is fixed to the verification of the connection of the output nodes.

An output of the output circuit may be provided with a terminating resistor. The test output buffer may directly control the output circuit. The test circuit may further comprise a test input buffer connected in parallel with input nodes of an input circuit to which a signal is applied, and the test input buffer receiving test data that are input to the input nodes. The test circuit may further comprise ESD protectors connected between the input nodes and the test input buffers.

The input circuit may receive a differential signal, and the test input buffer may receive test data that has been input to the differential input nodes. The test circuit may further comprise a circuit converting test data that has been input to the differential input nodes into a single end signal; and a test data processing circuit processing the test data. When the input circuit has a function of converting serial data into parallel data, the test data processing circuit may also have a function of converting serial data into parallel data.

The test data processing circuit may be constructed of a specific circuit that has a register function capable of performing scanning. The specific circuit having the register function may have a test terminal. A test clock, which is different from an operation clock of the input circuit, may be supplied to the test data processing circuit. The test data processing circuit may process test data which is fixed to the verification of the connection of the input nodes. The test circuit may carry out a JTAG test of a device in which a single end terminal and a differential terminal coexist.

Further, according to the present invention, there is provided a test circuit that is incorporated in a device having an input circuit for inputting a signal, and that carries out a verification of a connection of nodes of the device, the test circuit comprising a test data generating circuit generating test data for carrying out a verification of a connection of input nodes of the input circuit; and a test input buffer, connected in parallel with the input nodes, receiving test data from the test data generating circuit and inputting the test data to the input nodes.

In addition, according to the present invention, there is also provided a semiconductor integrated circuit device having an input circuit transmitting a signal, and a test circuit carrying out a verification of a connection of nodes, the test circuit comprising a test data generating circuit generating test data for carrying out a verification of a connection of input nodes of the input circuit; and a test input buffer, connected in parallel with the input nodes, receiving test data from the test data generating circuit and inputting the test data to the input nodes.

The test circuit may further comprise ESD protectors connected between the input nodes and the test input buffers.

BRIEF DESCRIPTION OF THE DRAWINGS

The present invention will be more clearly understood from the description of the preferred embodiments as set forth below with reference to the accompanying drawings, wherein:

FIG. 14 is a block circuit diagram showing a thirteenth embodiment of a test circuit relating to the present invention.

DETAILED DESCRIPTION OF THE PREFERRED EMBODIMENTS

Embodiments of a test circuit and a semiconductor integrated circuit device relating to the present invention will be explained, in detail, with reference to the attached drawings.

Figure 1:
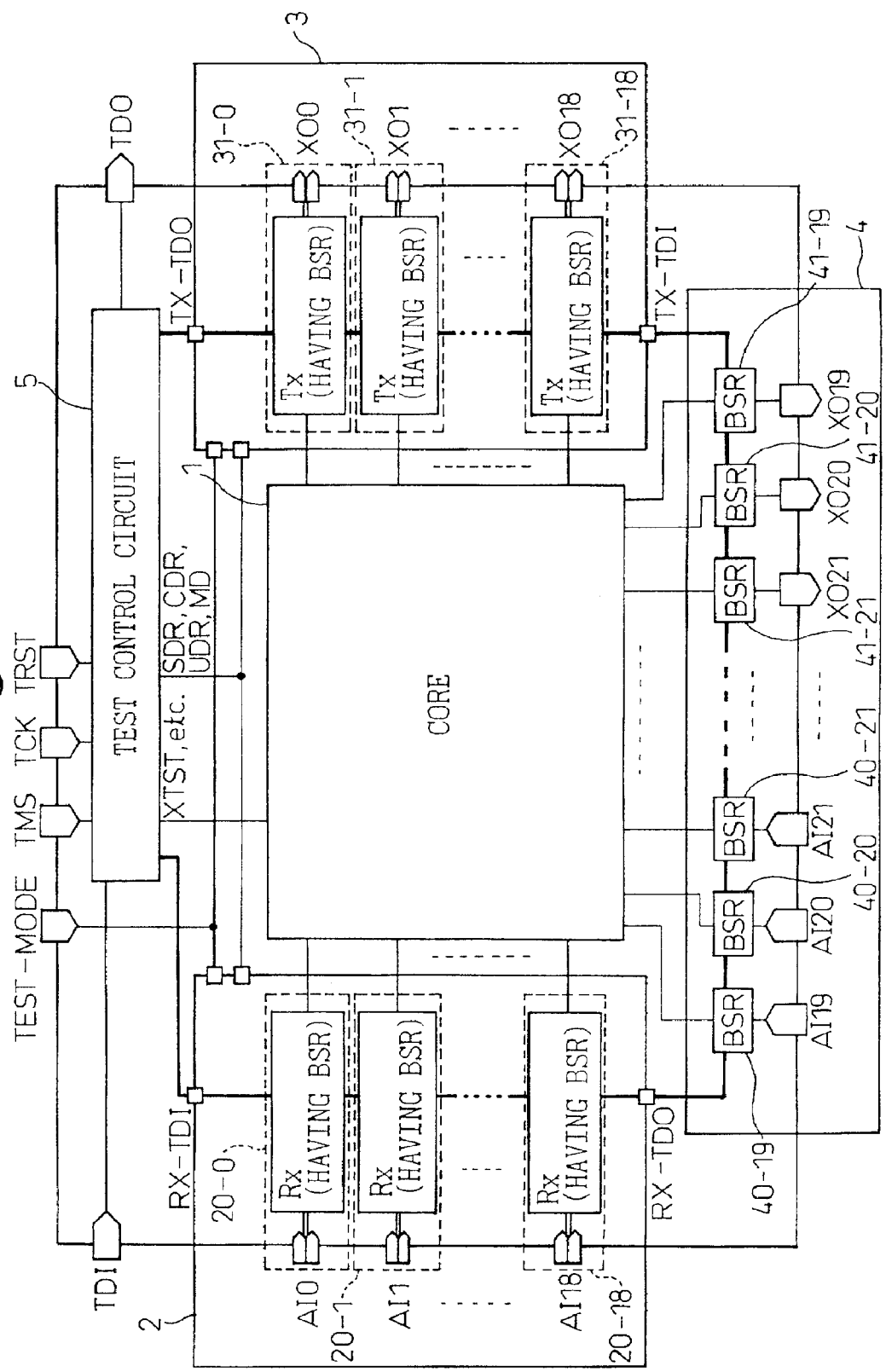
FIG. 1 is a block diagram showing one example of a semiconductor integrated circuit device to which a test circuit relating to the present invention is applied.

FIG. 1 is a block circuit diagram showing one example of a semiconductor integrated circuit device to which a test circuit relating to the present invention is applied. In FIG. 1, a reference number 1 denotes a core (core logic), 2 denotes a differential input circuit section (a receiving circuit macro), 3 denotes a differential output circuit section (a transmitting circuit macro), 4 denotes a single end section, and 5 denotes a test control circuit.

The input circuit section 2 has input circuits (receiving circuits) 20-0 to 20-18, each having a BSR (boundary scan register), to which differential input signals AI0 to AI18 are input. A terminal RX-TDI (a TDI for the input circuit) of the input circuit section 2 is connected to the test control circuit 5. A terminal RX-TDO (a TDO for the input circuit) of the input circuit section 2 is connected to a BSR 40-19 to which an input signal AI19 is input in the single end section 4. The input circuits 20-0 to 20-18, each having a BSR, are inserted manually. Embodiments of the input circuits 20-0 to 20-18, each having a BSR, will be explained in detail later with reference to the drawings (FIG. 6 to FIG. 10).

The output circuit section 3 has output circuits (transmitting circuits) 31-0 to 31-18, each having a BSR, from which differential output signals XO0 to XO18 are output. A terminal TX-TDO (a TDO for the output circuit) of the output circuit section 3 is connected to the test control circuit 5. A terminal TX-TDI (a TDI for the output circuit) of the output circuit section 3 is connected to a BSR 41-19 from which an output signal XO19 is output in the single end section 4. The output circuits 31-0 to 31-18, each having a BSR, are inserted manually. Embodiments of the output circuits 31-0 to 31-18, each having a BSR, will be explained in detail later with reference to the drawings (FIG. 2 to FIG. 5, and FIG. 11 to FIG. 14).

The single end section 4 has BSRs 40-19, 40-20, - - - to which input signals AI19, AI20, - - - of the single end are input respectively, and BSRs 41-19, 41-20, - - - from which output signals XO19, XO20, - - - of the single end are output respectively. The BSRs of the single end section 4 are automatically inserted in a similar manner to that of the conventional JTAG device.

The test control circuit (TAP controller) 5 is connected with terminals TDI, TMS, TCK, TRST, and TDO. In other words, like the conventional JTAG device, the semiconductor integrated circuit device (LSI) has the five terminals of the TDI, the TDO, the TMS, the TCK, and the TRST, and one test mode terminal TEST-MODE. Access is made from these terminals to the test control circuit 5 that is built into the device. Test data are also input and output to/from these terminals.

The terminal TDI (test data input) is a serial test data input terminal. Data or an instruction is input to this terminal TDI. When an instruction has been input, this instruction is transferred to an instruction register. When data has been input, this data is transferred to a data register.

The terminal TDO (test data output) is a serial test data output terminal that bypasses the data input from the terminal TDI or that sends out a value of the instruction register or the data register. The terminal TMS (test mode select) and the terminal TCK (test clock) are terminals of signals for controlling the test control circuit 5 incorporated in the JTAG device, and these realize a boundary scan architecture by controlling the data register, the instruction register, and a multiplexer.

The terminal TRST (test reset) is a terminal of a signal for initializing the test control circuit 5. This terminal may be set as an option.

As explained above, the semiconductor integrated circuit device shown in FIG. 1 provides a transmitting/receiving circuit macro having BSRs mounted on the differential input terminals and differential output terminals. It becomes possible to carry out a JTAG test at a system level based on this transmitting/receiving circuit macro. In the case of a single end signal (single signal), it is general that BSRs are automatically inserted by using a test combining tool. However, it is not possible to automatically insert in differential terminals by using this tool. It is necessary to manually insert BSRs for the differential transmitting terminals and differential receiving terminals. When they are provided as a macro, and are built into a BSR chain of single end terminals that have been inserted automatically, it becomes possible to carry out a JTAG test according to a single test control circuit. Based on the JTAG test (boundary scan test), it is possible to confirm a connection between circuit boards or between casings via a cable, for example, as well as a connection on the board.

Figure 2:
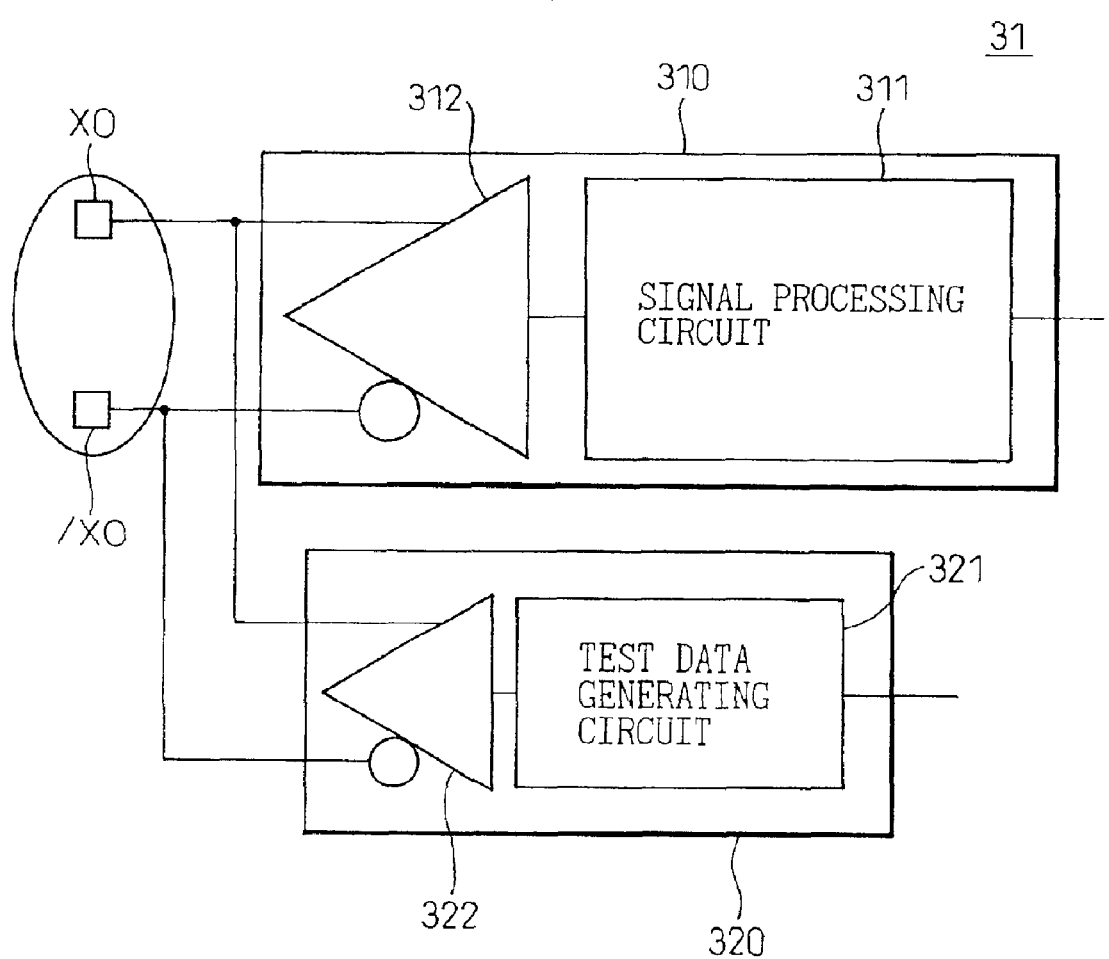
FIG. 2 is a block diagram showing a first embodiment of a test circuit relating to the present invention.

FIG. 2 is a block diagram showing a first embodiment of a test circuit relating to the present invention. This shows an example of an output circuit (transmitting circuit). In FIG. 2 (and in FIG. 3 to FIG. 5), a reference number 31 denotes an output circuit (corresponding to each of the output circuits 31-0 to 31-18, each having a BSR, in FIG. 1), 310 denotes a data output circuit, and 320 denotes a test data output circuit. XO and /XO denote differential output terminals (corresponding to the XO0 to XO18 shown in FIG. 1).

As shown in FIG. 2, the output circuit 31 is constructed of a data output circuit 310, and a test data output circuit 320 that is connected in parallel with this data output circuit 310. The data output circuit 310 has a signal processing circuit (output signal processing circuit) 311, and a data output buffer 312. The test data output circuit 320 has a test data generating circuit 321, and a test output buffer 322.

Output data of the semiconductor integrated circuit device is output from the signal processing circuit 311 to the differential output terminals XO and /XO via the differential data output buffer 312. Test data is output from the test data generating circuit 321 to the differential output terminals XO and /XO via the test output buffer 322.

In other words, in the first embodiment, the test output buffer 322 is connected to the output nodes (the differential output terminals XO and /XO) of the data output buffer 312, in parallel with the data output buffer 312.

Figure 3:
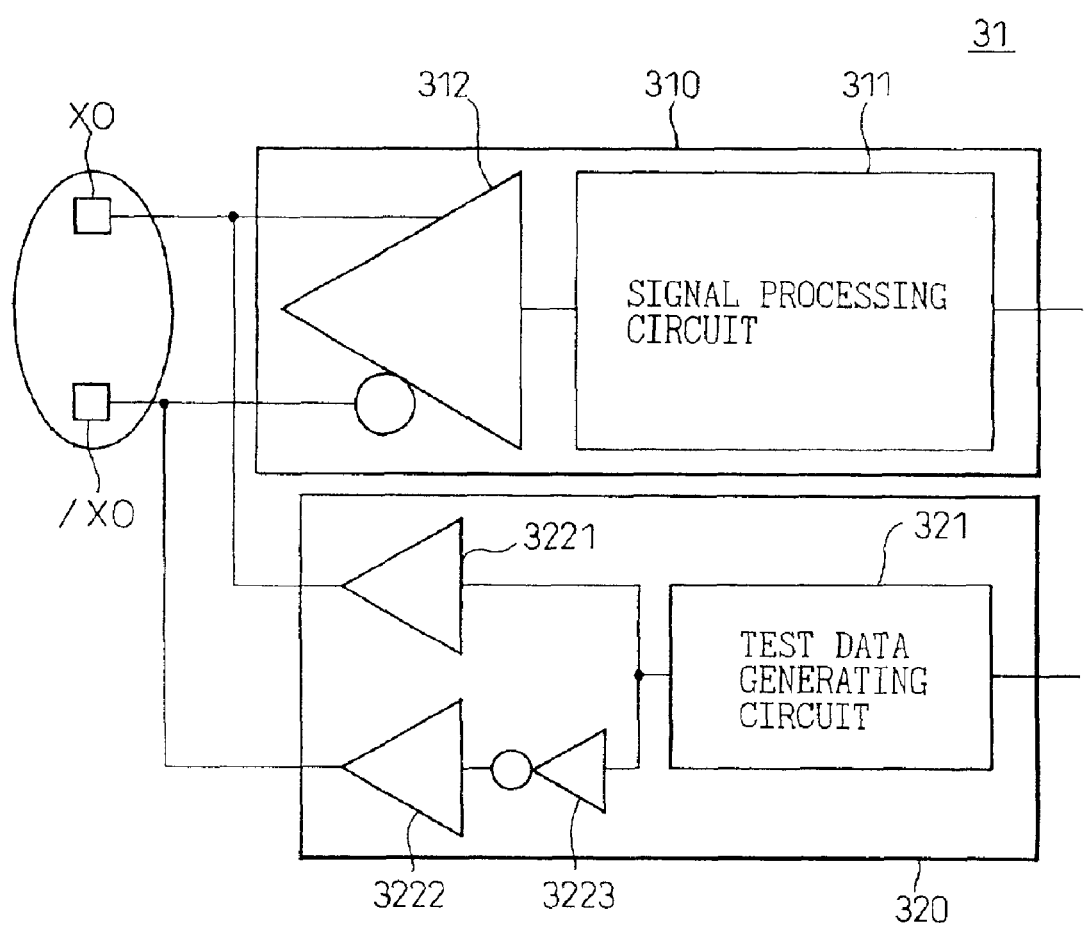
FIG. 3 is a block diagram showing a second embodiment of a test circuit relating to the present invention.

FIG. 3 is a block diagram showing a second embodiment of a test circuit relating to the present invention. In the second embodiment, a differential test output buffer 322 is constructed of two buffers 3221 and 3222, and an inverter 3223, as is clear from FIG. 3 in comparison with FIG. 2.

It is possible to arrange such that positive logic and negative logic are generated for the output data of the test data generating circuit 321, and differential test data is output by using two buffers of positive and negative. When the test data generating circuit 321 is constructed of a register that can perform scanning (scan register), it is possible to carry out boundary scanning at an external terminal of the semiconductor integrated circuit device (LSI chip).

Figure 4:
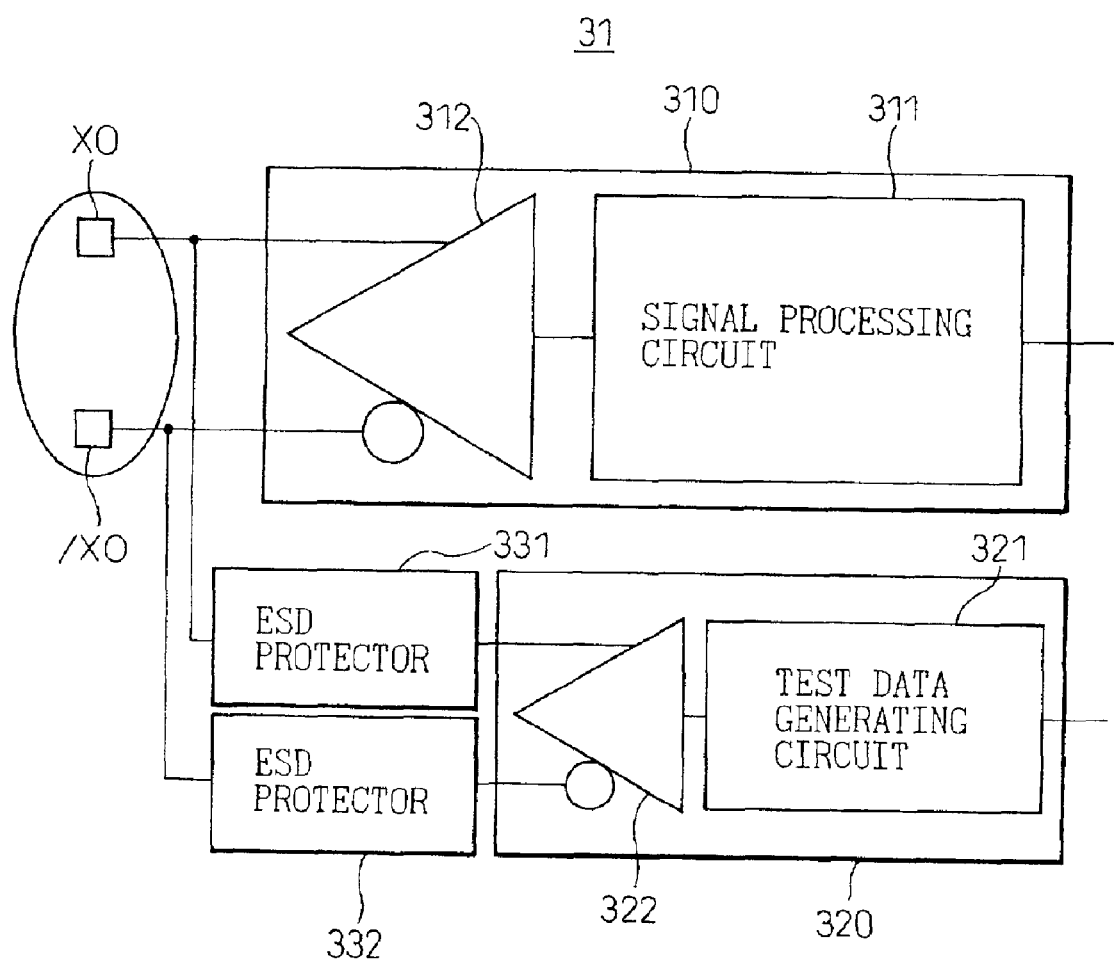
FIG. 4 is a block diagram showing a third embodiment of a test circuit relating to the present invention.

FIG. 4 is a block diagram showing a third embodiment of a test circuit relating to the present invention. In the third embodiment, ESD (electrostatic discharge) protectors 331 and 332 are inserted between a differential test output buffer 322 and output nodes XO and /XO respectively, as is clear from FIG. 4 in comparison with FIG. 2.

In the third embodiment, based on the provision of the ESD protectors 331 and 332 between the differential test output buffer 322 and the output nodes XO and /XO respectively, it becomes possible to improve the ESD proof characteristics of the test circuit.

Figure 5:
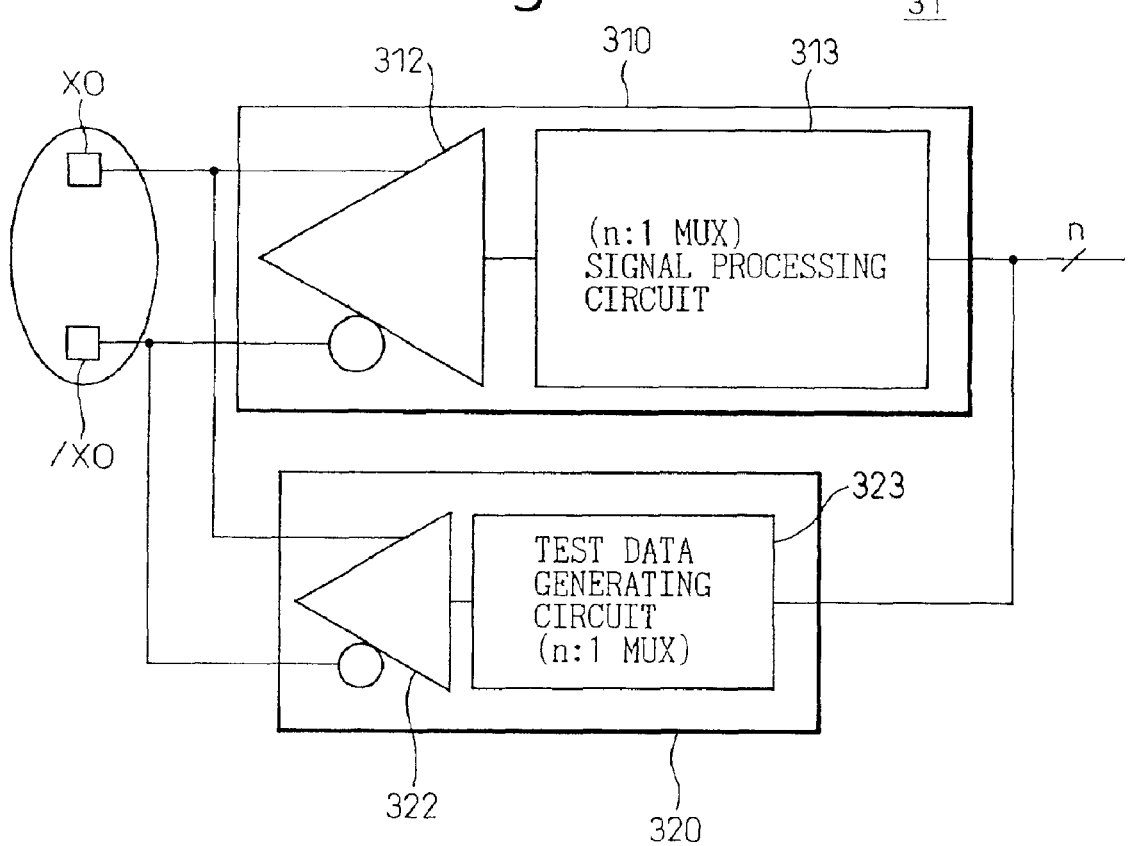
FIG. 5 is a block diagram showing a fourth embodiment of a test circuit relating to the present invention.

FIG. 5 is a block diagram showing a fourth embodiment of a test circuit relating to the present invention.

As shown in FIG. 5, in the fourth embodiment, a signal processing circuit 313 in a data output circuit 310 has a multiplexer function (n:1 MUX) for converting n-bit parallel data into serial data. Further, a test data generating circuit 323 in a test data output circuit 320 also generates test data in a sequence similar to that of the data output circuit 310.

When the test data generating circuit 323 (321) is constructed of a register that can perform scanning, it is possible to carry out boundary scanning by bypassing the data output circuit 310. When a test clock is supplied to the test data generating circuit 323 (321), independently of the data output circuit 310, it is also possible to carry out a test independently of the data output circuit 310.

Figure 6:
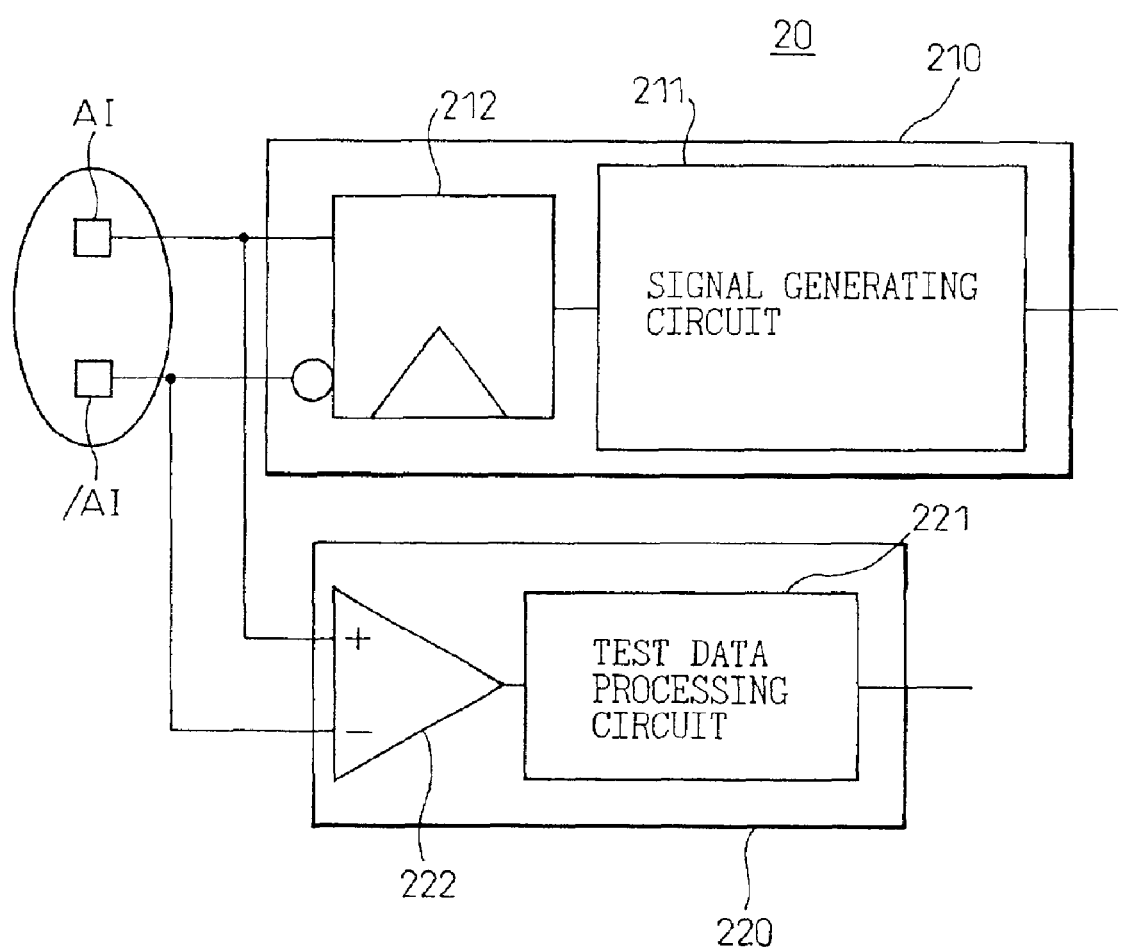
FIG. 6 is a block diagram showing a fifth embodiment of a test circuit relating to the present invention.

FIG. 6 is a block diagram showing a fifth embodiment of a test circuit relating to the present invention. This shows an example of an input circuit (receiving circuit). In FIG. 6 (and in FIG. 7 to FIG. 9), a reference number 20 denotes an input circuit (corresponding to each of the input circuits 20-0 to 20-18, each having a BSR, in FIG. 1), 210 denotes a data input circuit, and 220 denotes a test data input circuit. AI and /AI denote differential input terminals (corresponding to the AI0 to AI18 shown in FIG. 1).

As shown in FIG. 6, the input circuit 20 is constructed of a data input circuit 210, and a test data input circuit 220 that is connected in parallel with this input circuit 210. The data input circuit 210 has a signal processing circuit (input signal processing circuit) 211, and a data input buffer 212. The test data input circuit 220 has a test data processing circuit 221, and a test input buffer 222.

Data input from the differential input terminals AI and /AI of the semiconductor integrated circuit device are input to the signal processing circuit 211 via the data input buffer 212. Test data is input to the test data processing circuit 221 via the test input buffer 222.

In other words, in the fifth embodiment, the test input buffer 222 is connected to the input nodes (the differential input terminals AI and /AI) of the data input buffer 212, in parallel with the data input buffer 212.

Figure 7:
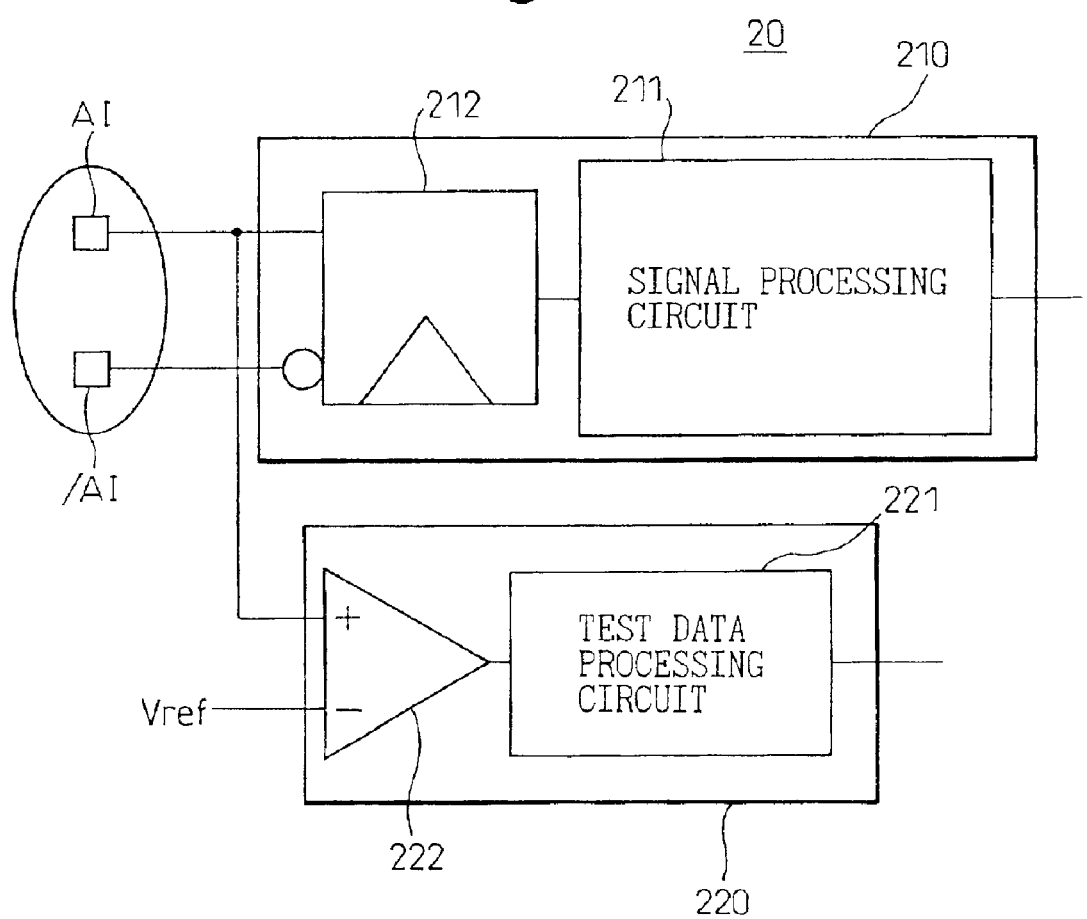
FIG. 7 is a block diagram showing a sixth embodiment of a test circuit relating to the present invention.

FIG. 7 is a block diagram showing a sixth embodiment of a test circuit relating to the present invention. In the sixth embodiment, one of inputs (a positive input) of the differential test input buffer 222 is connected to a positive input of the data input buffer 212. The other input (a negative input) of the differential test input buffer 222 is connected to a reference voltage Vref, thereby to receive differential test data, as is clear from FIG. 7 in comparison with FIG. 6. When the test data processing circuit 221 is constructed of a scan register, it is possible to carry out boundary scanning at an external terminal of the semiconductor integrated circuit device (LSI chip).

Figure 8:
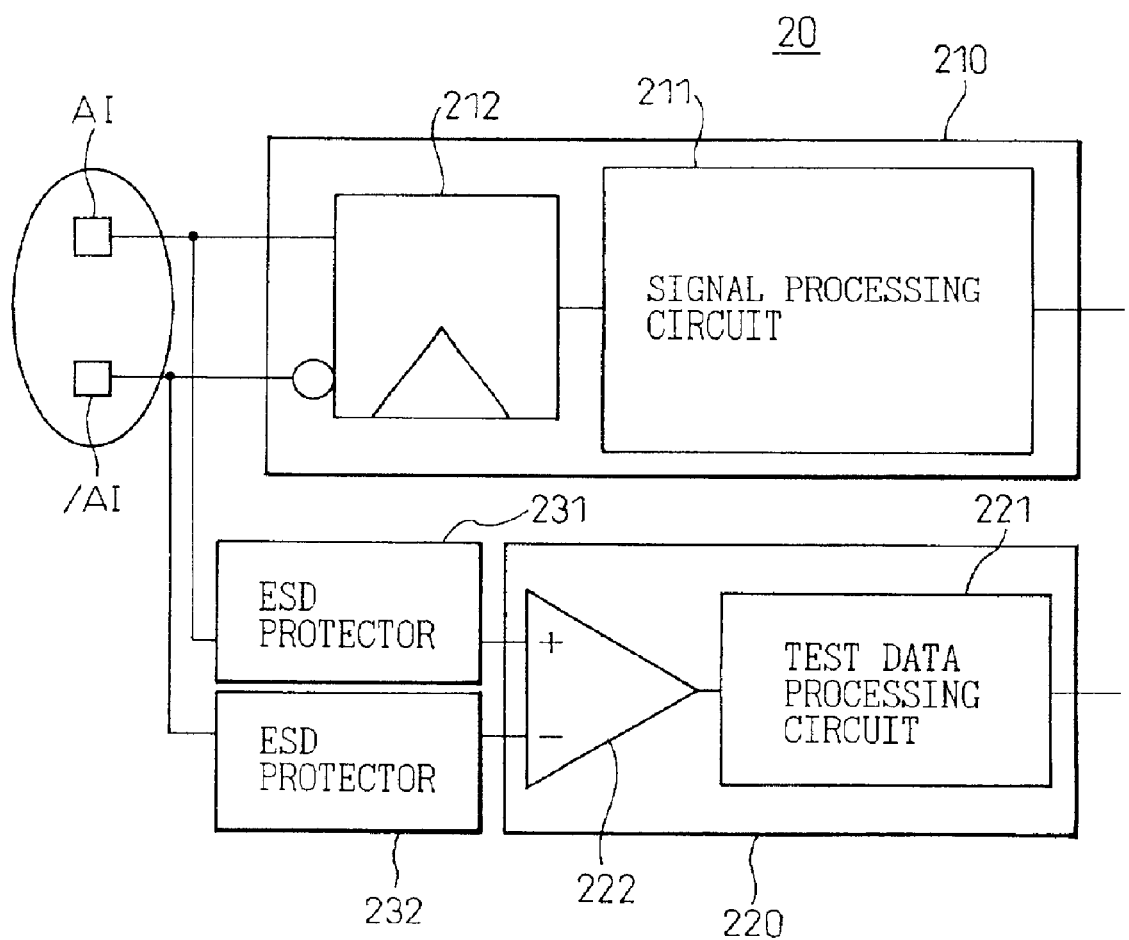
FIG. 8 is a block diagram showing a seventh embodiment of a test circuit relating to the present invention.

FIG. 8 is a block diagram showing a seventh embodiment of a test circuit relating to the present invention. In the seventh embodiment, ESD protectors 231 and 232 are inserted into between input nodes AI and /AI and a test input buffer 222 respectively, as is clear from FIG. 8 in comparison with FIG. 6.

In the seventh embodiment, based on the provision of the ESD protectors 231 and 232 between the input nodes AI and /AI and the test input buffer 222, it becomes possible to improve the ESD proof characteristics in the test circuit.

Figure 9:
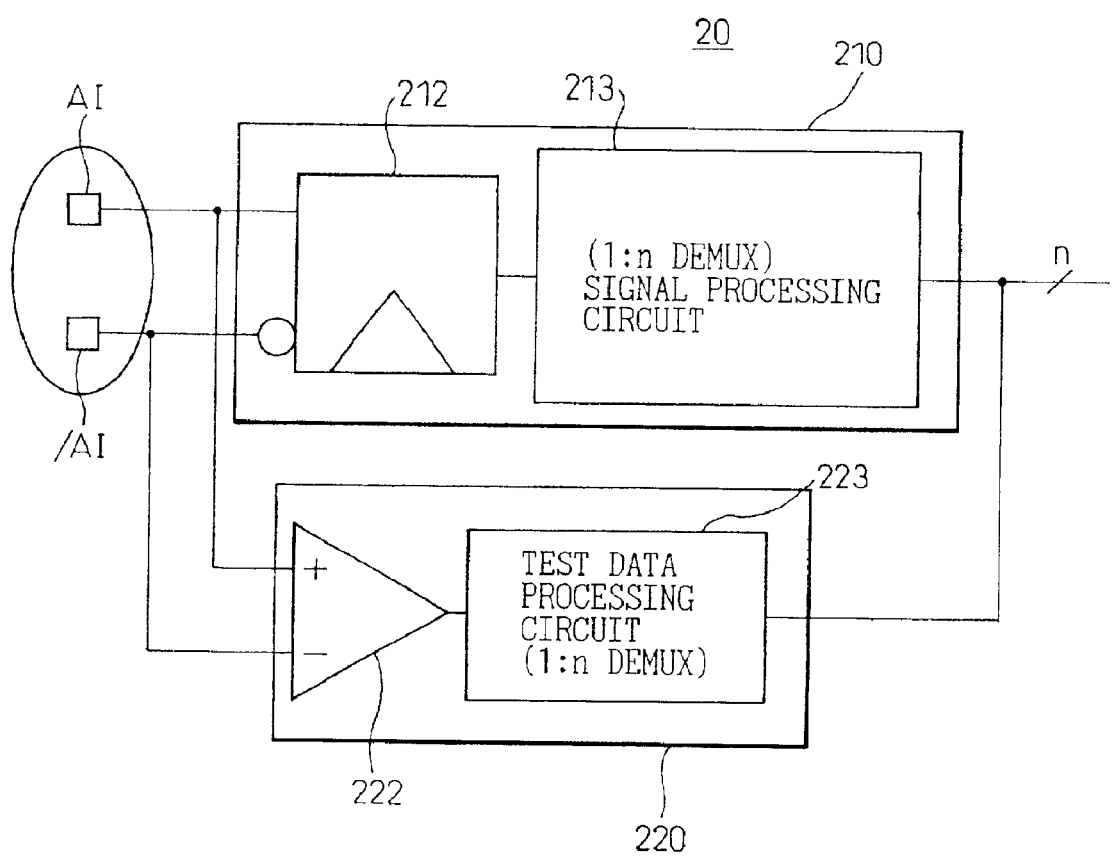
FIG. 9 is a block diagram showing an eighth embodiment of a test circuit relating to the present invention.

FIG. 9 is a block diagram showing an eighth embodiment of a test circuit relating to the present invention.

As shown in FIG. 9, in the eighth embodiment, a signal processing circuit 213 in a data input circuit 210 has a demultiplexer function (n:1 DEMUX) for converting serial data into n-bit parallel data. Further, a test data processing circuit 223 in a test data input circuit 220 also processes test data in a sequence similar to that of the data input circuit 210.

When the test data processing circuit 223 (221) is constructed of a register that can perform scanning, it is possible to carry out boundary scanning by bypassing the data input circuit 210. When a test clock is supplied to the test data processing circuit 223 (221) independent of the data input circuit 210, it is also possible to carry out a test independent of the data input circuit 210.

Figure 10:
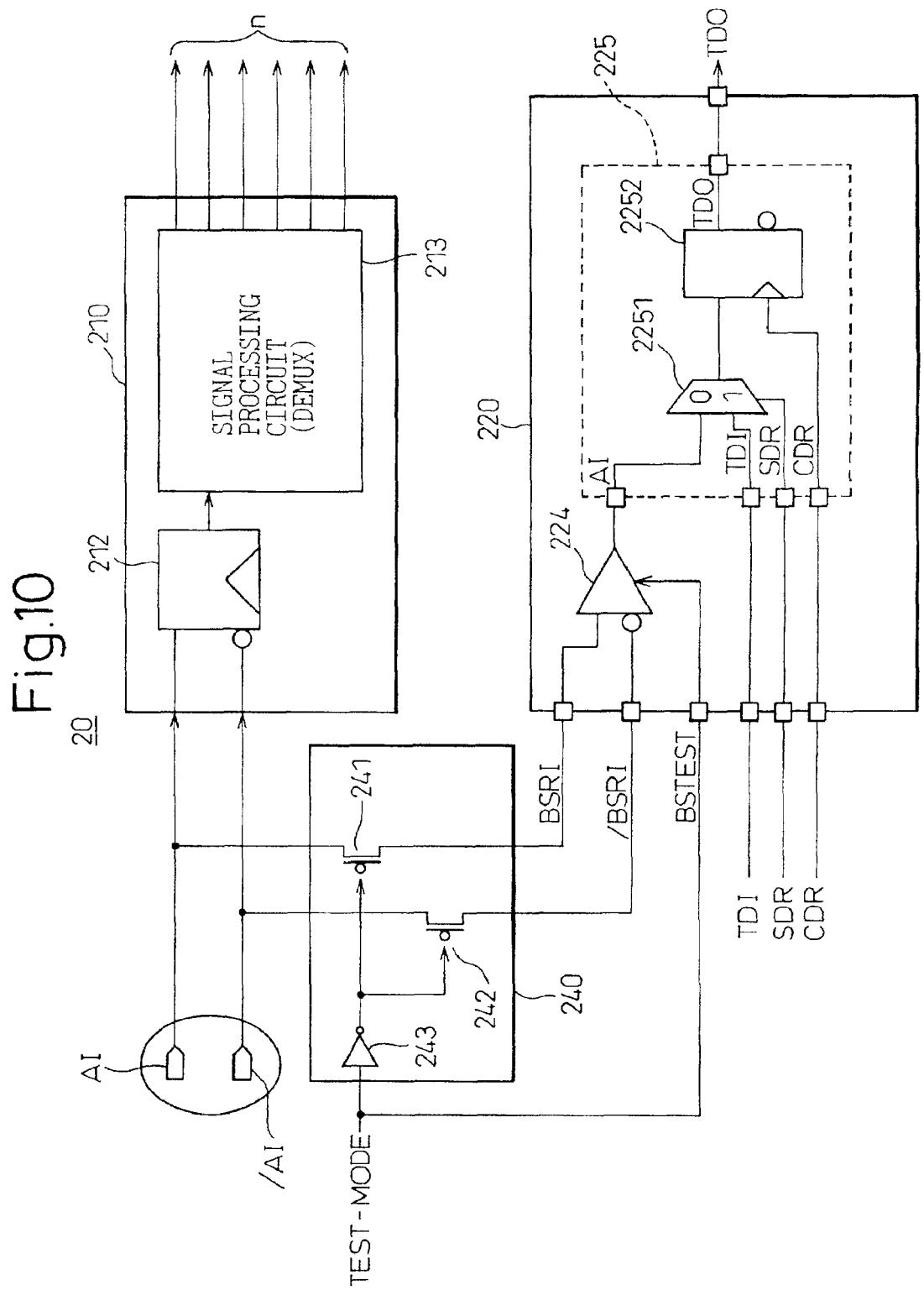
FIG. 10 is a block circuit diagram showing a ninth embodiment of a test circuit relating to the present invention.

FIG. 10 is a block circuit diagram showing a ninth embodiment of a test circuit relating to the present invention. This shows a boundary scan register (test data input circuit) 220 corresponding to a differential input. In FIG. 10, a reference number 224 denotes a differential sense amplifier (test input buffer), 225 denotes a test data processing circuit, and 240 denotes a pass gate circuit.

As shown in FIG. 10, in the ninth embodiment, the test data input circuit 220 includes the differential sense amplifier 224, and the test data processing circuit 225 that is constructed of a multiplexer 2251 and a flip-flop 2252. The pass gate circuit 240 that is controlled based on a test mode signal TEST-MODE is inserted into between differential input terminals AI and /AI and inputs of the differential sense amplifier 224. Reference symbols BSRI and /BSRI denote differential boundary scan register input signals (input terminal: boundary scan register input). The data input circuit 210 is constructed of a data input buffer 212, and a signal processing circuit 213 that has a demultiplexer function.

The pass gate circuit 240 is constructed of two p-channel MOS transistors (pMOS transistors) 241 and 242, and an inverter 243, to carry out ON/OFF control of the pMOS transistors (pass gates) 241 and 242 according to the test mode signal TEST-MODE.

In the ninth embodiment, the differential sense amplifier (test input buffer) 224 is controlled based on a test mode signal TEST-MODE (boundary scan test signal BSTEST). The test data input circuit 220 is input with a test data input signal (TDI), a shift data register signal (SDR), and a capture data register signal (CDR), and outputs a test data output signal (TDO).

In the ninth embodiment, the test data input circuit 220 is completely separated from the inside, and has a simple structure, in order to provide a test circuit that is limited to the checking of a connection with an external circuit.

Figure 11:
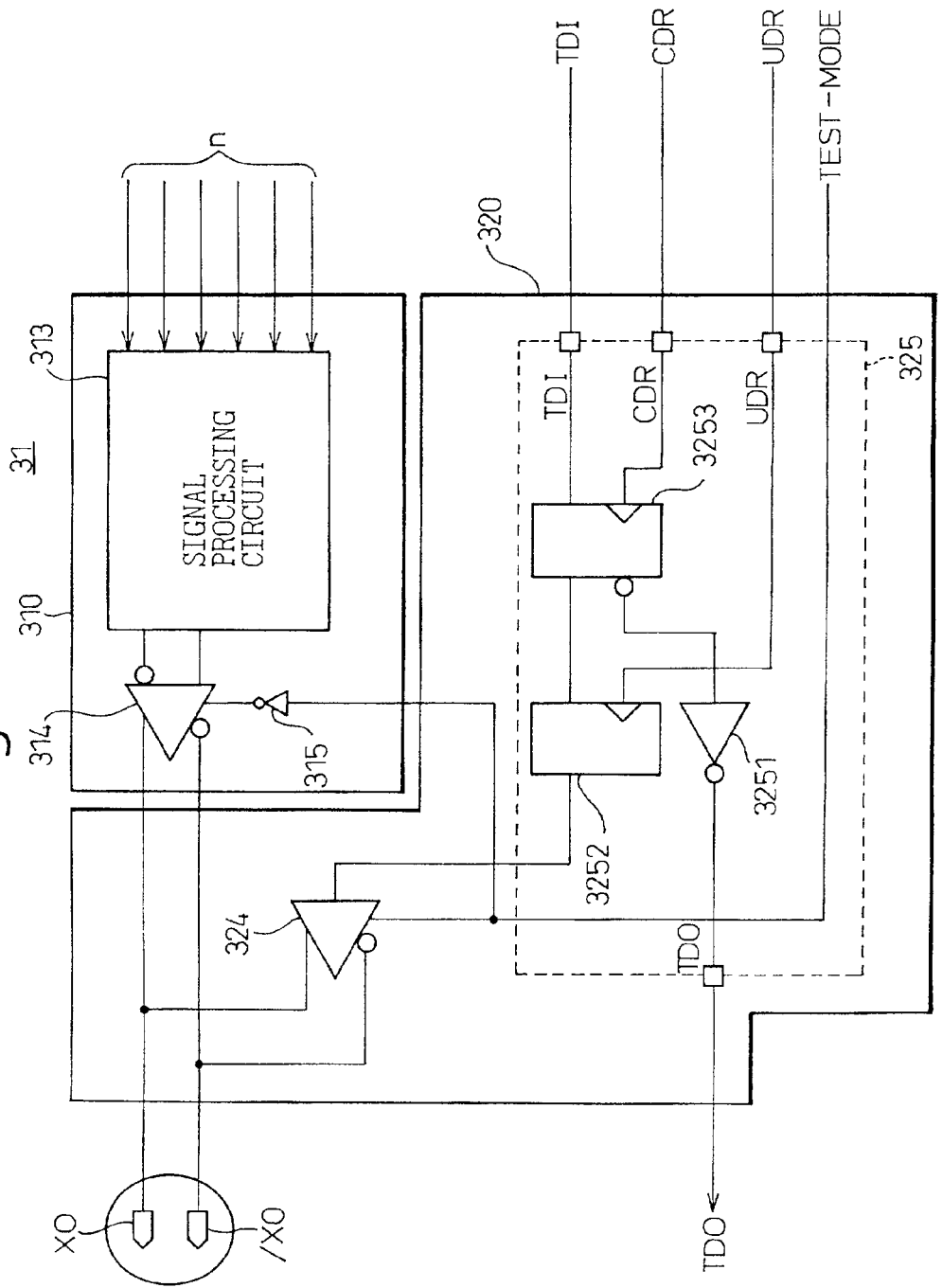
FIG. 11 is a block circuit diagram showing a tenth embodiment of a test circuit relating to the present invention.

FIG. 11 is a block circuit diagram showing a tenth embodiment of a test circuit relating to the present invention. This shows a boundary scan register (test data output circuit) 320 corresponding to a differential output. In FIG. 11, a reference number 324 denotes a sense amplifier (test output buffer), and 325 denotes a test data generating circuit.

In the tenth embodiment, the sense amplifier (test output buffer) 324 for outputting a differential signal to the test data output circuit 320 is provided, in order to make it possible to output a differential output signal.

The test data generating circuit 325 is constructed of an inverter 3251, a latch 3252, and a flip-flop 3253. The data output circuit 310 is constructed of a signal processing circuit 313 that has a multiplexer function, a data output buffer 314, and an inverter 315.

The test output buffer 324 is supplied with a test mode signal TEST-MODE, and the data output buffer 314 is supplied with a test mode signal TEST-MODE of which the level has been inverted by the inverter 315. Both the test output buffer 324 and the data output buffer 314 are controlled such that only one of these buffers becomes active, according to the test mode signal TEST-MODE. In other words, in order to avoid such a situation that the test data from the test data output circuit 320 collides with the data from the data output circuit (driver) 310, it is controlled as follows. The test output buffer 324 and the data output buffer 314 are controlled such that only one of these buffers is turned ON based on the test mode signal TEST-MODE.

In the tenth embodiment, the test data generating circuit 325 also receives a test data input signal (TDI), a capture data register signal (CDR), and an update data register signal (UDR), and outputs a test data output signal (TDO).

In the tenth embodiment, the test data output circuit 320 is completely separated from the inside, and has a simple structure, in order to provide a test circuit that is limited to the checking of a connection with an external circuit.

Figure 12:
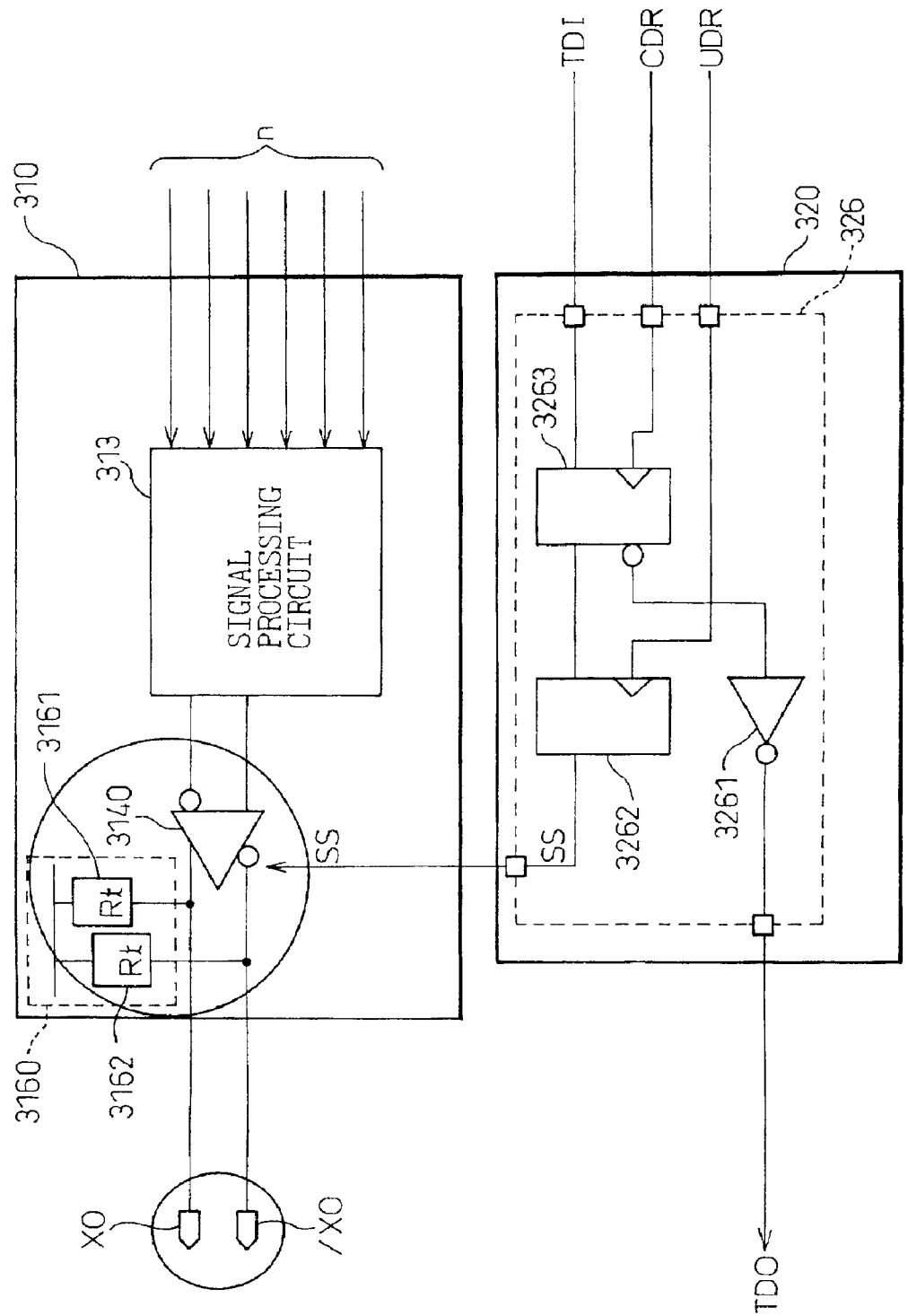
FIG. 12 is a block circuit diagram showing an eleventh embodiment of a test circuit relating to the present invention.

FIG. 12 is a block circuit diagram showing an eleventh embodiment of a test circuit relating to the present invention. In FIG. 12, a reference number 3140 denotes a driver (data output buffer), and 3160 denotes a terminating resistor section.

The method of the tenth embodiment requires the use of a transistor having a large size, in order to increase the driving capacity of the output signal. This has a risk of reducing the performance of high-speed data transfer due to the increased load. To avoid this problem, in the eleventh embodiment, the inside of the data output circuit 310 (the driver and the terminating resistor section) is controlled by using a single end signal SS as a signal from the test data output circuit 320. Based on this, a differential signal corresponding to the transmission data of the boundary scan register BSR (the output signal SS of the test data output circuit 320) is output to the outside. In other words, according to the eleventh embodiment, it is possible to prevent a reduction in the performance of high-speed data transfer, as there is no influence from a load.

As shown in FIG. 12, in the eleventh embodiment, the test data generating circuit 326 (the test data output circuit 320) is constructed of an inverter 3261, a latch 3262, and a flip-flop 3263. The data output circuit 310 is constructed of a signal processing circuit 313 that has a multiplexer function, a driver (data output buffer) 3140, and a terminating resistor section 3160.

A single end output signal of the latch 3262 is supplied to the driver 3140 to control this driver. Differential output terminals XO and /XO are provided with terminating resistors 3161 and 3162.

Figure 13:
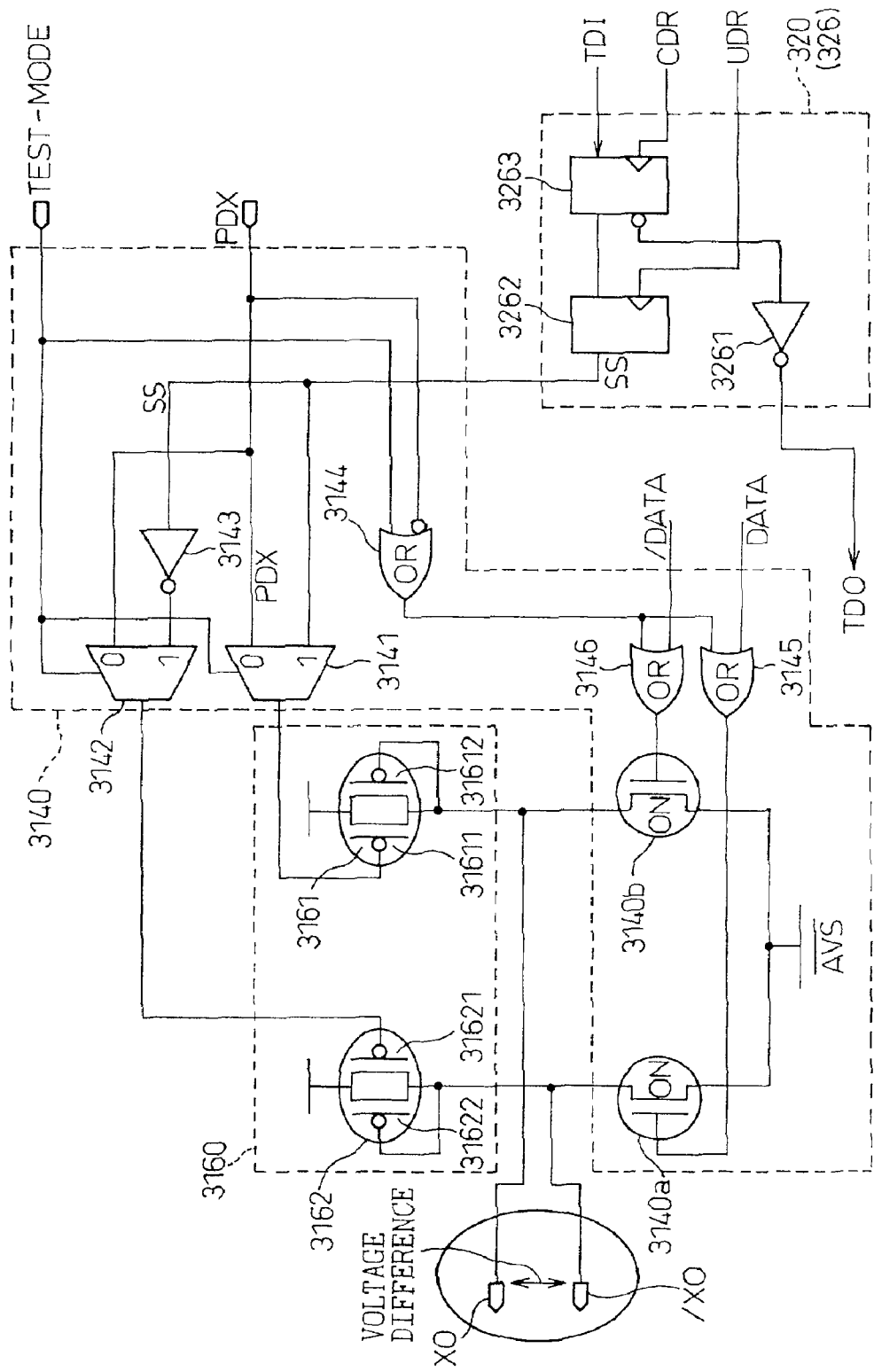
FIG. 13 is a block circuit diagram showing a twelfth embodiment of a test circuit relating to the present invention.

FIG. 13 is a block circuit diagram showing a twelfth embodiment of a test circuit relating to the present invention. This shows one example of a detailed structure of the eleventh embodiment shown in FIG. 12.

As shown in FIG. 13, in the twelfth embodiment, a driver 3140 is constructed of selectors 3141 and 3142, an inverter 3143, OR gates 3144 to 3146, and output transistors (nMOS transistors) 3140a and 3140b. A reference symbol PDX denotes a power down signal. This signal is usually at a high level "H", and becomes at a low level "L" when the power is down. A test mode signal TEST-MODE is usually at a lower level "L", and becomes at a high level "H" in a test mode.

As shown in FIG. 13, in the twelfth embodiment, a terminating resistor 3161 is constructed of pMOS transistors 31611 and 31612 that are connected in parallel, and a terminating resistor 3162 is constructed of pMOS transistors 31621 and 31622 that are connected in parallel. An output of the selector 3141 is supplied to a gate of the transistor 31611, and an output of the selector 3142 is supplied to a gate of the transistor 31621. One of the inputs (0 input) of the selectors 3141 and 3142 respectively is supplied with a power down signal PDX. The other input (1 input) of the selector 3141 is supplied with a single end output signal SS of the test data output circuit 320 (the test data generating circuit 326). The other input (1 input) of the selector 3142 is supplied with an output signal SS of the test data output circuit 320 of which level has been inverted by the inverter 3143. Both the selector 3141 and the selector 3142 are controlled based on the test mode signal TEST-MODE.

When the test mode signal TEST-MODE is at the low level "L" (normal time), the gates of the transistors 31611 and 31621 are supplied with the power down signal PDX. These transistor 31611 and 31621 are both OFF during a normal period, and they are both turned ON when the power is down. During a test (during a JTAG test), the test mode signal TEST-MODE becomes at the high level "H", and signals SS and /SS are supplied to the gates of the transistors 31611 and 31621 respectively. One of the transistors 31611 and 31621 is turned ON and the other is turned OFF according to the single end output signal SS of the test data output circuit 320 (the test data generating circuit 326).

A gate of the output transistor 3140a is supplied with an output of the OR gate 3145, and a gate of the output transistor 3140b is supplied with an output of an OR gate 3146. The OR gate 3145 is supplied with an output signal DATA of positive logic of a pre-driver, and an output of the OR gate 3144. The OR gate 3146 is supplied with an output signal /DATA of negative logic of a pre-driver, and an output of the OR gate 3144. The OR gate 3144 is supplied with the test mode signal TEST-MODE to its positive logic input, and is supplied with the power down signal PDX to its negative logic input. Therefore, during a test mode (when the test mode signal TEST-MODE is at the high level "H"), both the output transistors 3140a and 3140b are fixed to ON. When the power is down (when the power down signal PDX is at the low level "L"), both the output transistors 3140a and 3140b are also fixed to ON.

As explained above, according to the twelfth embodiment, the terminating resistors (pMOS transistors) 3161 and 3162 are controlled based on the output signal of the test data output circuit 320 (the transmission data of the boundary scan resistor BSR). A potential difference of the differential output terminals XO and /XO is adjusted based on this control. As a result, in the twelfth embodiment, it is possible to prevent a reduction in the performance of high-speed data transmission without receiving the influence of load.

FIG. 14 is a block circuit diagram showing a thirteenth embodiment of a test circuit relating to the present invention. This shows another example of a detailed structure of the eleventh embodiment shown in FIG. 12.

As shown in FIG. 14, in the thirteenth embodiment, a driver 3140 is constructed of selectors 3141 and 3142, an inverter 3143, output resistors (nMOS transistors) 3140a and 3140b, OR gates 3151 and 3152, AND gates 3153 to 3156, and nMOS transistors 3157 and 3158.

According to the thirteenth embodiment, the output transistors 3140a and 3140b that are fixed to ON during a test mode (when the test mode signal TEST-MODE is at the high level "H") in the twelfth embodiment are fixed to OFF during the test mode. Further, in the thirteenth embodiment, the nMOS transistors 3157 and 3158 are provided corresponding to differential output terminals XO and /XO respectively. These transistors 3157 and 3158 are controlled such that they are ON when pMOS transistors 31611 and 31621 of a terminating resistor section 3160 are OFF respectively. A potential difference of the differential output terminals XO and /XO is adjusted based on this control. As a result, in the thirteenth embodiment, it is also possible to prevent a reduction in the performance of high-speed data transmission without receiving an influence of a load.

As explained in detail above, according to the present invention, it is possible to provide a test circuit capable of effectively performing a verification of a connection of nodes between LSIs that handle high-speed differential signals, and a semiconductor integrated circuit device to which this test circuit is applied.

Many different embodiments of the present invention may be constructed without departing from the spirit and scope of the present invention, and it should be understood that the present invention is not limited to the specific embodiments described in this specification, except as defined in the appended claims.

What is claimed is:

1. A test circuit that is incorporated in a device, the test circuit being operable to carry out a verification of a first connection node for outputting a signal of said device in a usual operation, said test circuit comprising:
    a test data generating circuit operable to generate test data for carrying out said verification;
    a test output buffer connected to said first connection node, the test output buffer being operable to receive test data from said test data generating circuit and to output the test data to said first connection node; and
    a test input circuit connected to a second connection node to which a signal is applied, said test input circuit being operable to receive test data that are input to said second connection node.

2. The test circuit as claimed in claim 1, wherein said test circuit further comprises a test data processing circuit operable to process said test data.

3. The test circuit as claimed in claim 1, wherein the input signal is a differential signal, the circuit or device further comprising a data input buffer operable to convert the differential input signal to a single end signal, and to supply the single end signal to an internal circuit.

4. The test circuit as claimed in claim 1, further comprising a test data processing circuit operable to process said test data, said test data processing circuit comprising at least one flip-flop circuit.

5. A test circuit that is incorporated in a device, the test circuit being operable to carry out a verification of a first connection node for outputting a signal of said device in a usual operation, said test circuit comprising:
    a test data generating circuit operable to generate test data for carrying out said verification;
    a test output buffer connected to said first connection node, the test output buffer being operable to receive test data from said test data generating circuit and to output the test data to said first connection node; and
    ESD protectors connected to said first connection node.

6. A test circuit that is incorporated in a device, the test circuit being operable to carry out a verification of a first connection node for outputting a signal of said device in a usual operation, said test circuit comprising:
    a test data generating circuit operable to generate test data for carrying out said verification;
    a test output buffer connected to said first connection node, the test output buffer being operable to receive test data from said test data generating circuit and to output the test data to said first connection node; and
    a circuit operable to supply said test data to said first connection node based on a test mode signal.

7. A test circuit that is incorporated in a device, the test circuit being operable to carry out a verification of a first connection node for outputting a signal of said device in a usual operation, said test circuit comprising:
    a test data generating circuit operable to generate test data for carrying out said verification;
    a test output buffer connected to said first connection node, the test output buffer being operable to receive test data from said test data generating circuit and to output the test data to said first connection node; and
    a data output buffer operable to convert a single end signal from an internal circuit to a differential, and to supply the differential signal to said first connection node.

8. A test circuit that is incorporated an a device, the test circuit being operable to carry out a verification of a first connection node for outputting a signal of said device in a usual operation, said test circuit comprising:
    a test data generating circuit operable to generate test data for carrying out said verification;
    a test output buffer connected to said first connection node, the test output buffer being operable to receive test data from said test data generating and to output the test data to said first connection node,
    wherein a signal line connected to said first connection node is provided with a terminating resistor.

9. A semiconductor integrated circuit device having an output circuit operable to transmit a signal via a first connection node, and a test circuit operable to carry out a connection verification of said first connection node in a usual operation, said test circuit comprising:
    a test data generating circuit operable to generate test data for carrying out the connection verification of said first connection node; and
    a test output buffer connected to said output circuit, the test output buffer being operable to receive test data from said test data generating circuit and to output the test data to said first connection node,
    wherein said output circuit is operable to output a differential signal to said first connection node.

10. The semiconductor integrated circuit device as claimed in claim 9, wherein said test circuit is operable to carry out the connection verification of said first connection node in a differential signal status.

11. A semiconductor integrated circuit device having an output circuit operable to transmit a signal via a first connection node, and a test circuit operable to carry out a connection verification of said first connection node in a usual operation, said test circuit comprising:
    a test data generating circuit operable to generate test data for carrying out the connection verification of said first connection node;
    a test output buffer connected to said output circuit, the test output buffer being operable to receive test data from said test data generating circuit and to output the test data to said first connection node; and
    ESD protectors connected to said first connection node.

12. A semiconductor integrated circuit device having an output circuit operable to transmit a signal via a first connection node, and a test circuit operable to carry out a connection verification of said first connection node in a usual operation, said test circuit comprising:
    a test data generating circuit operable to generate test data for carrying out the connection verification of said first connection node;
    a test output buffer connected to said output circuit, the test output buffer being operable to receive test data from said test data generating circuit and to output the test data to said first connection node;

an input circuit operable to receive a signal input via a second connection node; and a test input buffer, connected to said second connection node, and operable to receive test data input to said second connection node.

13. The semiconductor integrated circuit device as claimed in claim 12, wherein said input circuit is operable to receive a differential signal.

14. The semiconductor integrated circuit device as claimed in claim 12, wherein said test circuit further comprises a test data processing circuit operable to process said test data.

15. The semiconductor integrated circuit device as claimed in claim 12, wherein the input signal is a differential signal, the circuit of device further comprising a data input buffer operable to convert the differential input signal to a single end signal, and to supply the single end signal to an internal circuit.

16. The semiconductor integrated circuit device as claimed in claim 12, further comprising a test data processing circuit operable to process said test data, said test data processing circuit comprising at least one flip-flop circuit.

17. A semiconductor integrated circuit device having an output circuit operable to transmit a signal via a first connection node, and a test circuit operable to carry out a connection verification of said first connection node in a usual operation, said test circuit comprising:

a test data generating circuit operable to generate test data for carrying out the connection verification of said first connection node; and a test output buffer connected to said output circuit, the test output buffer being operable to receive test data from said test data generating circuit and to output the test data to said first connection node, wherein the semiconductor integrated circuit device is further operable to carry out a JTAG test of a device in which a single end terminal and a differential terminal coexist.

18. A semiconductor integrated circuit device having an output circuit operable to transmit a signal via a first connection node, and a test circuit operable to carry out a connection verification of said first connection node in a usual operation, said test circuit comprising:

a test data generating circuit operable to generate test data for carrying out the connection verification of said first connection node; and a test output buffer connected to said output circuit, the test output buffer being operable to receive test data from said test data generating circuit and to output the test data to said first connection node; and a circuit operable to supply said test data to said first connection node based on a test mode signal.

19. A semiconductor integrated circuit device as having an output circuit operable to transmit a signal via a first connection node, and a test circuit operable to carry out a connection verification of said first connection node in a usual operation, said test circuit comprising:

a test data generating circuit operable to generate test data for carrying out the connection verification of said first connection node;

a test output buffer connected to said output circuit, the test output buffer being operable to receive test data from said test data generating circuit and to output the test data to said first connection node; and a data output buffer operable to convert a single end signal from an internal circuit to a differential signal, and to supply the differential signal to said first connection node.

20. A semiconductor integrated circuit device having an output circuit operable to transmit a signal via a first connection node, and a test circuit operable to carry out a connection verification of said first connection node in a usual operation, said test circuit comprising:

a test data generating circuit operable to generate test data for carrying out the connection verification of said first connection node; and a test output buffer connected to said output circuit, the test output buffer being operable to receive test data from said test data generating circuit and to output the test data to said first connection node, wherein a signal line connected to said first connection node is provided with a terminating resistor.

21. A semiconductor integrated circuit device having an output circuit operable to transmit a signal via a first connection node, and a test circuit operable to carry out a connection verification of said first connection node in a usual operation, said test circuit comprising:

a test data generating circuit operable to generate test data for carrying out the connection verification of said first connection node; and a test output buffer connected to said output circuit, the test output buffer being operable to receive test data from said test data generating circuit and to output the test data to said first connection node, wherein said test data generating circuit comprises a circuit that has a register function capable of performing scanning.

22. A test circuit operable to carry out a verification of a connection node for outputting a signal in a usual operation, comprising:

a test data generating circuit operable to generate single end test data for carrying out said verification; and a selector circuit, operable to select the single end test data or a signal from an internal circuit based on a test mode signal, the selector circuit being further operable to convert the selected data or signal to a differential signal, and to output the differential signal.

23. A semiconductor integrated circuit device operable to carry out a verification of a connection node for inputting a signal in a usual operation, comprising:

a data in input buffer operable to receive data input to said connection node;

a test input buffer, connected to said connection node, operable to receive test data input to said connection node; and a test data processing circuit operable to process said test data, wherein the input signal is a differential signal.

24. A semiconductor integrated circuit device operable to carry out a verification of a connection node for inputting a signal in a usual operation, comprising:

a data input buffer operable to receive data input to said connection node;

a test input buffer, connected to said connection node, operable to receive test data input to said connection node; and a test data processing circuit operable to process said test data; and ESD protectors connected to said connection node.

25. A semiconductor integrated circuit device operable to carry out a verification of a connection node for inputting a signal in a usual operation, comprising:

a data input buffer operable to receive data input to said connection node;

a test input buffer, connected to said connection node, operable to receive test data input to said connection node;

a test data processing circuit operable to process said test data;

a converting circuit operable to convert the input differential signal to a single end signal; and a data processing circuit operable to process the single end signal.

26. A semiconductor integrated circuit device operable to carry out a verification of a connection node for inputting a signal in a usual operation, comprising:

a data input buffer operable to receive data input to said connection node;

a test input buffer, connected to said connection node, operable to receive test data input to said connection node; and a test data processing circuit operable to process said test data, wherein said test data processing circuit comprises at least one flip-flop circuit.

27. A semiconductor integrated circuit device operable to carry out a verification of a connection node for inputting a signal in a usual operation, comprising:

a data input buffer operable to receive data input to said connection node;

a test input buffer, connected to said connection node, operable to receive test data input to said connection node; and a test data processing circuit operable to process said test data; and a test data generating circuit comprising a circuit that has a register function capable of performing scanning.

* * * * *